United States Patent
Han et al.

(10) Patent No.: US 8,484,585 B2
(45) Date of Patent: Jul. 9, 2013

(54) METHOD FOR CONTROLLING PATTERN UNIFORMITY OF SEMICONDUCTOR DEVICE

(75) Inventors: Duk Sun Han, Icheon (KR); Mi Hye Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 48 days.

(21) Appl. No.: 12/915,570

(22) Filed: Oct. 29, 2010

(65) Prior Publication Data

US 2011/0276928 A1 Nov. 10, 2011

(30) Foreign Application Priority Data

May 7, 2010 (KR) .................. 10-2010-0043035

(51) Int. Cl.
*G06F 17/50* (2006.01)
(52) U.S. Cl.
USPC .......................................................... 716/53
(58) Field of Classification Search
USPC .................................... 716/100, 53
See application file for complete search history.

(56) References Cited

U.S. PATENT DOCUMENTS

| 7,247,412 B2* | 7/2007 | Lee .................................. 430/30 |
| 7,685,556 B2* | 3/2010 | Fukuhara et al. ............... 716/54 |
| 2003/0061595 A1* | 3/2003 | Ki et al. .......................... 716/21 |
| 2004/0229138 A1* | 11/2004 | Ki et al. ............................. 430/5 |
| 2005/0188341 A1* | 8/2005 | Fukuhara et al. ............... 716/19 |
| 2005/0275820 A1* | 12/2005 | Fukuhara et al. ............... 355/69 |
| 2008/0148218 A1* | 6/2008 | Kawakami et al. ............. 716/21 |
| 2009/0202139 A1* | 8/2009 | Toyoda et al. ................ 382/145 |
| 2009/0317732 A1* | 12/2009 | Itoh et al. ........................ 430/22 |
| 2010/0151364 A1* | 6/2010 | Ye et al. ........................... 430/5 |
| 2010/0260427 A1* | 10/2010 | Cao et al. ..................... 382/218 |

FOREIGN PATENT DOCUMENTS

| KR | 1020030007951 A | 1/2003 |
| KR | 1020080045067 A | 5/2008 |

* cited by examiner

*Primary Examiner* — Suchin Parihar

(57) ABSTRACT

A method for controlling uniformity of patterns formed in a semiconductor device includes obtaining simulation contours with respect to respective cases while controlling a size of an outermost pattern and determining a size of the outermost pattern in which uniform distribution values (3σ) value of patterns included in the simulation contours satisfying specific conditions as a size of target outermost pattern.

20 Claims, 5 Drawing Sheets

METHOD FOR CONTROLLING PATTERN UNIFORMITY OF SEMICONDUCTOR DEVICE

CROSS-REFERENCES TO RELATED APPLICATIONS

The priority of Korean patent application No. 10-2010-0043035 filed on May 7, 2010, the disclosure of which is hereby incorporated in its entirety by reference, is claimed.

BACKGROUND OF THE INVENTION

The present invention relates to a semiconductor device, and more particularly, to a method for controlling uniformity of patterns formed in a semiconductor device.

Generally, photolithography is a technology for creating high integration semiconductor devices by forming patterns in a predetermined shape on a wafer substrate using light. Namely, light (e.g., an ultraviolet ray, an electron beam, or an X ray) is irradiated onto a photoresist layer where a predetermined portion of the photoresist layer is exposed to the light using a photo-mask. Then a part of the photoresist layer having large solubility with respect to a developing solution is removed to form a photoresist pattern in a predetermined shape. The part of the layer (underneath the photo resist pattern) exposed by the photo resist pattern is removed by an etch process to form a desired semiconductor device pattern.

However, as the semiconductor device becomes highly integrated and a design rule has been rapidly reduced, various problems occur due to a resolution limit of the photolithography process. For example, the critical dimension (CD) uniformity on a wafer becomes deteriorated. That is, when patterns designed with the same CD are transferred on a wafer using the same photo mask, CDs of transferred patterns can be significantly changed according to the transfer location of the patterns.

When the CDs of the transferred patterns are not uniform, a line pattern may be slanted as shown in FIG. 1 and reduce a process margin. When the CDs of the transferred patterns are not uniform, a bridge may be generated between hole patterns as shown in FIG. 2 and thereby reduce the process margin.

In the related art, an assist feature (AF) is used to solve such a pattern uniformity problem.

However, as the semiconductor devices have become ultra dense, it is not easy to use the AF because of the following restrictions.

The AF needs interval optimization with a main pattern. If the AF is located too far apart from a target pattern, a required interference effect may be reduced. Conversely, if the AF is located too close to the main pattern to maximize the interference effect, scum can occur from the AF itself.

Further, the AF requires optimization of a pattern size since the scum can be prevented and the interference effect can be maximized only if the pattern size of the AF is optimized.

Moreover, although the AF has the optimized pattern size suitable for an optional photolithography process, the AF should have a pattern size where a photo-mask maker can check a pattern. Up to now, it is known that a pattern size ranging from 40 nm to 50 nm can be checked by the photo-mask maker. The photo-mask maker, however has difficulties in checking the patterns if the pattern size is less than 40 nm. Recently, as the photolithography process moves from a KrF process ($\lambda$=248 nm) to an ArF process ($\lambda$=193 nm), an AF used for the KrF process is applied to the ArF process. However, most of the AF causes scum on a wafer. According to data analysis results obtained from many experiments and simulations, an available pattern size of the AF applicable to the ArF process is less than or equal to 35 nm. However, the photo-mask maker has difficulty checking this pattern size so may not be able to check an optimal AF pattern size that is suitable for the ArF process.

Therefore, there is required a method capable of efficiently enhancing the CD uniformity without significantly modifying existing exposure systems.

BRIEF SUMMARY OF THE INVENTION

Embodiments of the present invention are directed to a method for improving CD uniformity on a wafer and a process margin (e.g., depth of focus (DOF) margin) by controlling a size of an outermost pattern among target patterns.

According to an aspect of the present invention, a method for controlling pattern uniformity in semiconductor device includes: providing an initial layout with respect to target patterns; obtaining uniform distribution values with respect to sizes of the target patterns while changing a reference size associated with a reference pattern in the initial layout; and defining a size of the changed reference size that corresponds to one of the uniform distribution values obtained as a size of a target reference pattern.

In accordance with an aspect of the present invention, a method for controlling pattern uniformity in semiconductor device further includes: performing optical proximity correction (OPC) on inner patterns at an inner side of the outermost pattern in the target patterns, wherein the reference pattern is an outermost pattern in the initial layout.

The one of the uniform distribution value is less than or equal to about 3 nm when the target pattern includes a one-dimension (1D) pattern. The one of the uniform distribution value is less than or equal to about 5 nm when the target pattern is a two-dimension (2D) pattern. Changing the size of the reference pattern comprises changing one or both of a space size and a pattern width of the reference pattern when the target pattern includes a 1D pattern. Changing the size of the reference pattern comprises changing an X-direction space size or a Y-direction space size of the reference pattern when the target pattern includes a 2D pattern. The inner patterns at the inner side of the target outermost pattern are formed to have the same size as a cell. Obtaining the uniform distribution values comprises: obtaining simulation contours with respect to sizes of the target patterns while changing the size of an outermost pattern in the original layout; and obtaining the uniform distribution values corresponding to the respective simulation contours. Changing the size of the reference pattern comprises changing the size of the reference pattern in a range of approximately 20% to approximately 70% of a simulation contour corresponding to the initial layout.

According to another aspect of the present invention, a method for controlling pattern uniformity in semiconductor device includes: providing an original layout with respect to target patterns; obtaining simulation contours with respect to sizes of the target patterns while changing sizes of plural outer patterns in the original layout; obtaining uniform distribution values with respect to patterns included in the respective simulation contours; and defing a changed size of the outer patterns corresponding to one of the obtained uniform distribution values as a size of target outer pattern.

In accordance with another aspect of the present invention, a method for controlling pattern uniformity in semiconductor device further comprising: performing optical proximity correction (OPC) on inner patterns at an inner side of the target outer patterns among the target patterns.

The one of the uniform distribution values is less than or equal to about 3 nm when the target pattern includes a 1D pattern. The one of the uniform distribution values is less than or equal to about 5 nm when the target pattern includes a 2D pattern. Changing the sizes of the plural outer patterns comprises changing one or both of a space size and a line width of each of the plural outer patterns when the target pattern includes a 1D pattern. Changing the sizes of the plurality outer patterns comprises changing an X-direction space size or a Y-direction space size of the plural outer patterns when the target pattern includes a 2D pattern. The inner patterns at an inner side of the target outer patterns are formed to have the same size as a cell. Changing the sizes of the plural outer patterns comprises changing the sizes of the plural outer pattern in a range of approximately 20% to approximately 70% of corresponding simulation contour corresponding to the original layout.

According to another aspect of the present invention, a method for controlling pattern uniformity in semiconductor device comprising: providing an original layout with respect to target patterns; obtaining uniform distribution values with respect to inner patterns disposed at an inner side of at least one outer pattern including an outermost pattern for respective sizes while changing a size of the at least one outer pattern in the original layout; and determining a changed size of the at least one outer pattern corresponding to one of the obtained uniform distribution values as a size of a target outer pattern.

Obtaining the uniform distribution values includes: obtaining simulation contours with respect to the sizes of the respective target patterns while changing the sizes of the at least one outer pattern in the designed original layout; and obtaining the uniform distribution values with respect to patterns included in the respective simulation contours. Changing the size of the at least one outer pattern comprises changing one or both of a space size and a line width of the at least one outermost pattern when the target pattern includes a 1D pattern. Changing the size of the at least one outer pattern comprises changing an X-direction space size or a Y-direction space size of the at least one outer pattern when the target pattern includes a 2 Dimension (2D) pattern.

DESCRIPTION OF EMBODIMENTS

The present invention relates to a method for improving critical dimension (CD) uniformity of inner patterns by controlling an outermost pattern or plural outer patterns among target patterns without inserting an AF or changing design with respect to a layout of patterns. As used herein, the inner patterns refer to patterns other than the outermost pattern or the plural outer patterns among the target patterns.

Embodiments of the present invention are described in detail with reference to the accompanying drawings.

Figure 1:
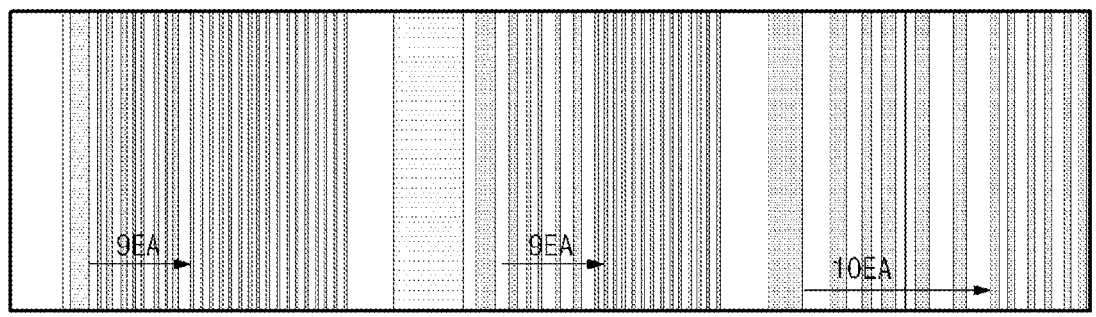
FIG. 1 is a view illustrating a shape of a line pattern in which a leaning phenomenon occurs due to non-uniform CD of the pattern.
Figure 2:
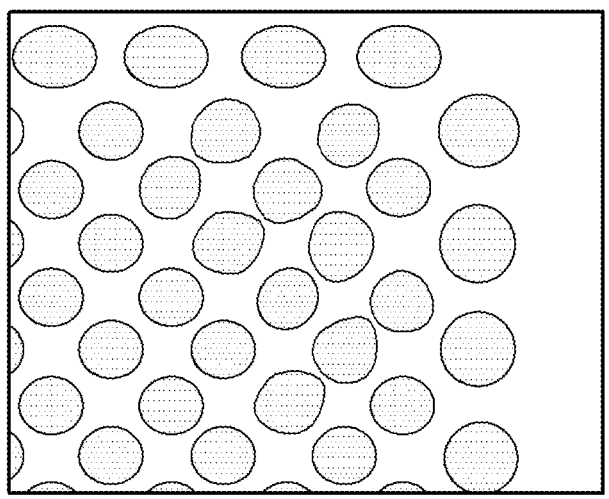
FIG. 2 is a view illustrating a shape of a hole pattern in which a bridge phenomenon occurs due to non-uniform CD of the pattern.
Figure 3:
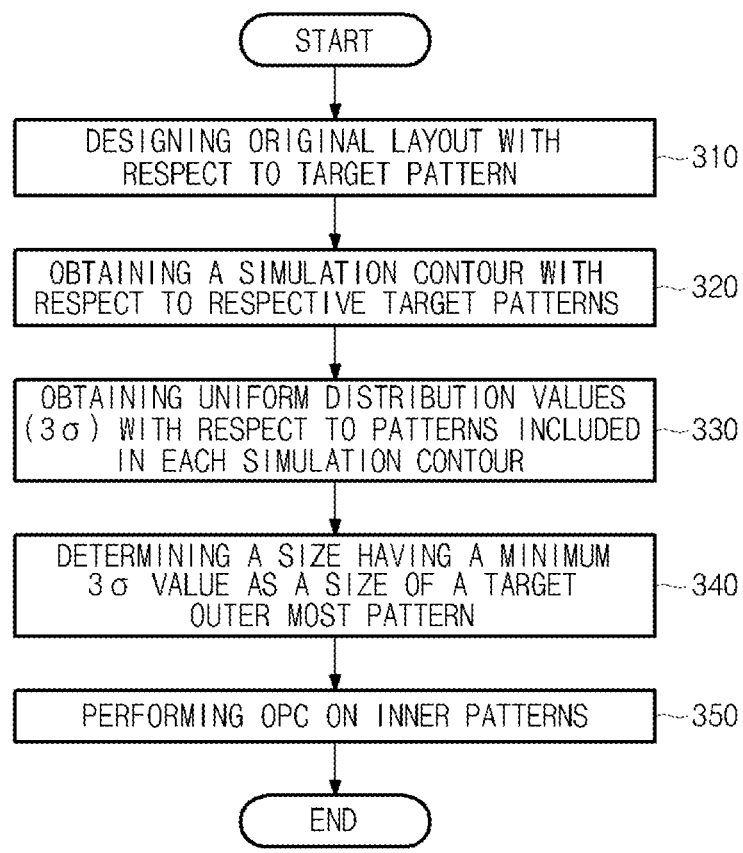
FIG. 3 is a flowchart illustrating a method for controlling pattern uniformity of a semiconductor device according to an embodiment of the present invention.

FIG. 3 is a flowchart illustrating a method for controlling pattern uniformity of a semiconductor device according to an embodiment of the present invention.

An original layout with respect to target patterns is designed (step 310).

At this time, the original layout is a mask layout. For example, the original layout may be a layout of patterns having a uniform size, and the patterns are formed at predetermined intervals. The pattern may include a one-dimensional (1D) pattern (e.g., line and space pattern) or a 2D pattern (e.g., isolated pattern or hole pattern) formed in a cell region of the semiconductor device. In this embodiment, the target pattern includes a 1D pattern.

When the design with respect to the original layout is terminated, a simulation contour of each of the target patterns is obtained by changing a size, e.g., a pattern width or a space width, associated with an outermost pattern by stages (step 320). The size associated with the outermost pattern is also referred to as a reference size or reference space. The pattern width refers to the width of the pattern such as a line pattern. The space width refers to the distance between two patterns.

In this case, the remaining patterns of the target patterns except for the outermost pattern, i.e., patterns (referred to as 'inner pattern' hereinafter) formed at an inner side of the outermost pattern, have a uniform size so that they have the same size as a cell, and the target patterns are simulated while changing their sizes to obtain the simulation contour with respect to each target pattern.

Further, the size of the outermost pattern may be changed in a range of 20%~70% of the simulation contour obtained with respect to the original layout.

Next, sizes (e.g., line widths) of patterns included in the simulation contour are measured by changing the size (or reference size(s)) associated with the outermost pattern to obtain uniform distribution values (3σ(sigma)) with respect to the references sizes that have been changed (step 330).

TABLE 1

| S1  | PWL00 | PWL01 | PLW02 | PLW03 | PLW04 | PLW05 | PLW06 | PLW16 | PLW26 | PLW27 |
|-----|-------|-------|-------|-------|-------|-------|-------|-------|-------|-------|
| 120 | 50.4  | 42.3  | 38.8  | 39.7  | 41.6  | 42.1  | 41.6  | 42.0  | 41.8  | 42.4  |
| 140 | 45.2  | 40.3  | 38.4  | 39.4  | 41.3  | 41.8  | 41.6  | 41.1  | 42.1  | 41.6  |
| 160 | 41.3  | 39.7  | 38.3  | 39.4  | 40.3  | 40.7  | 41.0  | 40.8  | 41.6  | 41.3  |
| 180 | 41.0  | 39.5  | 38.3  | 39.0  | 40.3  | 41.3  | 41.2  | 41.0  | 40.2  | 41.1  |
| 200 | 40.7  | 39.1  | 38.8  | 39.9  | 41.4  | 42.5  | 42.2  | 42.4  | 41.9  | 42.0  |

| S1  | PLW28 | PLW29 | PLW30 | PLW31 | PLW32 | Max  | Min  | Range | 3σ   |
|-----|-------|-------|-------|-------|-------|------|------|-------|------|
| 120 | 41.8  | 41.2  | 39.5  | 42.5  | 50.0  | 50.4 | 38.8 | 11.6  | 10.0 |
| 140 | 42.1  | 41.0  | 39.9  | 40.4  | 44.3  | 45.2 | 38.4 | 6.8   | 5.2  |
| 160 | 41.1  | 39.4  | 39.5  | 40.1  | 40.8  | 41.6 | 38.3 | 3.3   | 2.8  |

TABLE 1-continued

| 180 | 40.4 | 39.2 | 37.8 | 38.9 | 39.7 | 41.3 | 37.8 | 3.5 | 3.3 |
| 200 | 42.0 | 40.1 | 38.9 | 39.7 | 40.3 | 42.5 | 38.8 | 3.7 | 4.1 |

Figure 4:
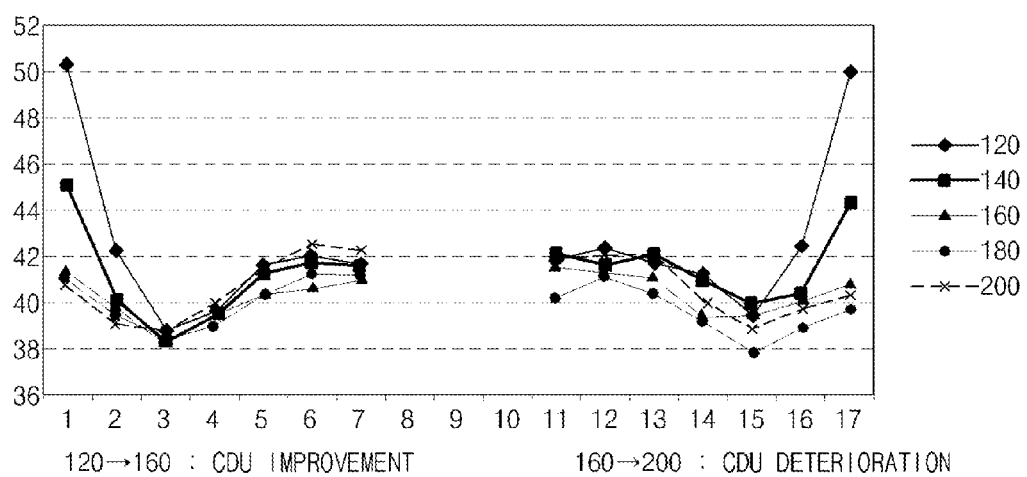
FIGS. 4, 5a and 5b are graphs illustrating simulation results according to an embodiment of the present invention.

Table 1 shows simulation results with respect to line widths of inner patterns, maximum and minimum line widths, a variation range of the line width and a uniform distribution value (3σ), and FIG. 4 is a view illustrating values of Table 1 as a graph. In Table 1, S1 represents a space size between the outermost pattern and an inner pattern adjacent to the outermost pattern. In FIG. 4, the Y axis represents line widths of inner patterns (nm) and X-axis represents positions of inner patterns.

Referring to Table 1 and FIG. 4, it is understood that the space size (or reference space) between the outermost pattern and the inner pattern adjacent to the outermost pattern is controlled and thereby change the CD uniformity of the inner patterns. Namely, it is noticed that the size (e.g., the space size) of the outermost pattern may be changed to control the CD uniformity of the inner patterns. As can be seen from FIG. 4, the CD uniformity is improved as the space size S1 is increased, and when the space size exceeds a specific value e.g., 160 nm, the CD uniformity begins deteriorating again. Namely, it can be seen that when the outermost pattern has the space size, e.g. 160 nm, the uniform distribution value (3σ) has a minimum value of 2.8 as shown in Table 1, and the CD uniformity of the target patterns is at an optimum level at that time.

Although it is not shown, in the case of a 2D pattern such as a hole pattern, the CD uniformity with respect to the inner patterns can be adjusted by considering the outermost pattern as 1D patterns having a space size in an X direction and a space size in a Y direction.

Accordingly, in this embodiment of the present invention, when the step 330 is terminated, the size of the outermost pattern having a minimum 3σ value obtained from the simulation results is determined as a size of a target outermost pattern (step 340).

However, during the simulation, if a simulation target range (e.g., a simulation range with respect to the outermost pattern) is erroneously determined, although the size having the minimum 3σ value obtained from the simulation results is selected as the size of the target outermost pattern, the CD uniformity cannot be improved.

Figure 5A:
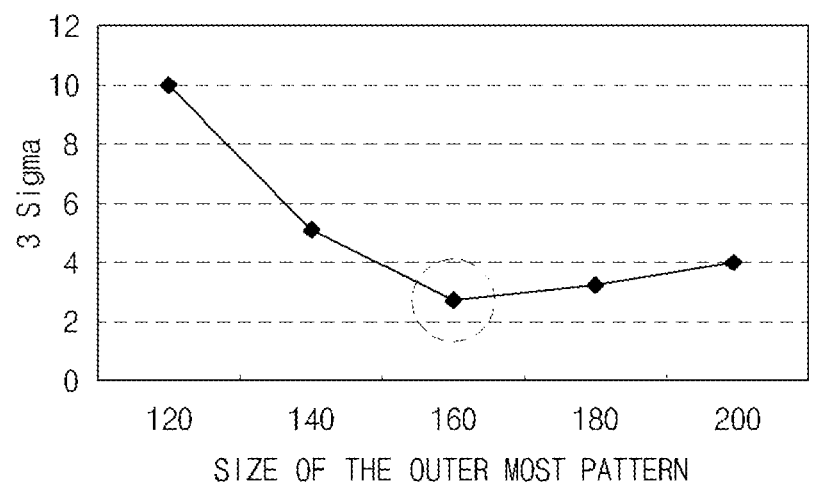
Figure 5B:
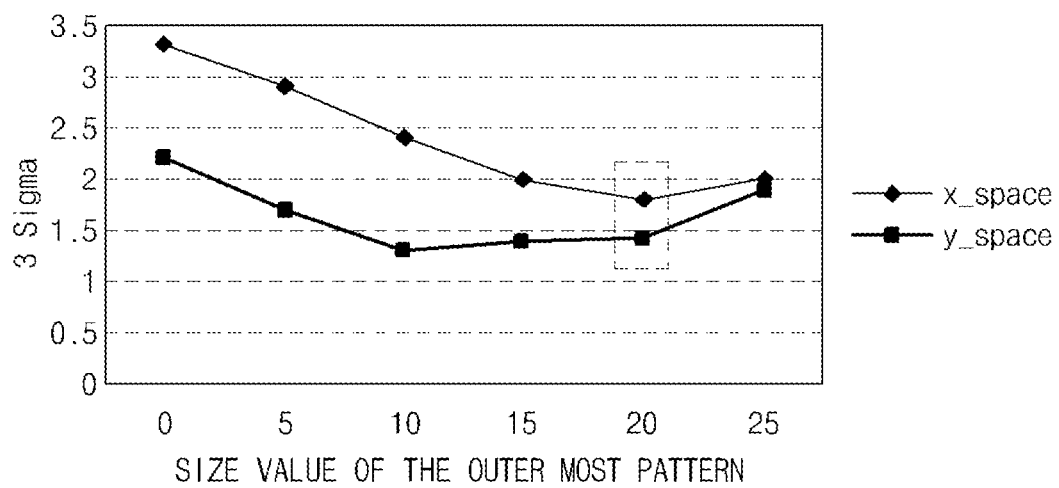

Consequently, in accordance with this embodiment of the present invention, when the size has the minimum 3σ value, and the minimum 3σ value is less than or equal to a specific value, the size of the corresponding outermost pattern is determined as the size of the target outer-most pattern. Namely, in the case of a 1D pattern, as shown in FIG. 5a, when the 3σ value is less than or equal to 3 nm and has the minimum value, the size of the outermost pattern at that time is determined as the size of the target outermost pattern. Meanwhile, in the case of a 2D pattern, as shown in FIG. 5b, when both of a 3σ value with respect to the space size in the X direction and a 3σ value with respect to the space size in the Y direction are less than or equal to 5 nm and have the minimum value, the size of the outermost pattern at that time is determined as the size of the target outermost pattern.

When the target outer-most pattern is determined, optical proximity correction (OPC) is performed on the inner patterns to accomplish a layout of a final target pattern (step 350).

At this time, an OPC process is performed in the same manner as that of the related art, and thus the detailed description thereof is omitted.

The method for controlling uniformity of patterns according to the embodiment of the present invention described above can be used to form a layout of a photo-mask pattern.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

For example, the foregoing embodiment has been described where the space size of the outermost pattern is changed. However, it will be apparent that the CD uniformity of patterns can be controlled in a case where a line width or a hole size of the outermost pattern is adjusted.

Furthermore, although the foregoing embodiment has been described where the space size of the outermost pattern is controlled, a size of at least one pattern adjacent to the outermost pattern among the inner patterns can also be controlled. Namely, as mentioned above, sizes of plural outer patterns including the outer-most pattern may be simultaneously controlled to obtain simulation contours. The sizes of the outer patterns in which 3σ values of the patterns included in the simulation contours satisfying the foregoing conditions can be determined as the sizes of target outer patterns.

What is claimed is:

1. A computer-implemented method for controlling pattern uniformity in a semiconductor device in a computer network, the computer-implemented method comprising:
   providing an initial layout of a photo-mask with respect to target patterns, wherein the initial layout includes a reference pattern and inner patterns disposed at an inner side of the reference pattern;
   changing, using a processor, a size of the reference pattern, the size of the reference pattern including one or both of a space size and a pattern width;
   obtaining, using a processor, uniform distribution values with respect to changed sizes of target patterns corresponding to the inner patterns according to the size change of the reference pattern; and
   defining, using a processor, a changed size of the reference pattern that corresponds to one of the uniform distribution values as a size of a target reference pattern.

2. The computer-implemented method of claim 1, further comprising performing, using a processor, optical proximity correction (OPC) on the inner patterns.

3. The computer-implemented method of claim 1, wherein the one of the uniform distribution values is less than or equal to about 3 nm when the target pattern includes a one-dimensional (1D) pattern.

4. The computer-implemented method of claim 1, wherein the one of the uniform distribution values is less than or equal to about 5 nm when the target pattern includes a two-dimensional (2D) pattern.

5. The computer-implemented method of claim 1, wherein the reference pattern is an outermost pattern, and
   wherein changing the size of the reference pattern comprises changing, using a processor, one or both of a space size and a pattern width of the reference pattern when the target pattern includes a 1D pattern.

6. The computer-implemented method of claim 1, wherein the reference pattern is an outermost pattern, and
   wherein changing the size of the reference pattern comprises changing, using a processor, an X-direction space size or a Y-direction space size of the reference pattern when the target pattern includes a 2D pattern.

7. The computer-implemented method of claim 2, wherein the reference pattern is an outermost pattern, the target reference pattern being a target outermost pattern, and
   wherein the inner patterns at the inner side of the target outermost pattern are formed to have the same size as a cell.

8. The computer-implemented method of claim 1, wherein the reference pattern is an outermost pattern, the target reference pattern being a target outermost pattern, and wherein obtaining the uniform distribution values comprises:
   obtaining, using a processor, simulation contours with respect to the changed sizes of the target patterns corresponding to the inner patterns according to the size change of the reference pattern; and
   obtaining, using a processor, the uniform distribution values corresponding to the respective simulation contours.

9. The method of claim 8, wherein changing the size of the reference pattern comprises changing, using a processor, the size of the reference pattern in a range of approximately 20% to approximately 70% of a simulation contour corresponding to the initial layout.

10. A computer-implemented method for controlling pattern uniformity in a semiconductor device in a computer network, the method comprising:
    providing an original layout of a photo-mask with respect to target patterns, wherein the original layout includes outer patterns and inner patterns disposed at an inner side of the outer patterns;
    changing, using a processor, sizes of plural outer patterns, the sizes of the plural outer patterns including one or both of space sizes and pattern widths;
    obtaining, using a processor, simulation contours with respect to changed sizes of target patterns corresponding to the inner patterns according to the size change of the plural outer patterns;
    obtaining, using a processor, uniform distribution values with respect to patterns included in the respective simulation contours; and
    defining, using a processor, a changed size of the outer patterns corresponding to one of the uniform distribution values as a size of target outer patterns.

11. The computer-implemented method of claim 10, further comprising performing, using a processor, optical proximity correction (OPC) on the inner patterns.

12. The computer-implemented method of claim 10, wherein the one of the uniform distribution values is less than or equal to about 3 nm when the target pattern includes a 1D pattern.

13. The computer-implemented method of claim 10, wherein the one of the uniform distribution values is less than or equal to about 5 nm when the target pattern includes a 2D pattern.

14. The computer-implemented method of claim 10, wherein changing the sizes of the plural outer patterns comprises changing, using a processor, one or both of a space size and a line width of each of the plural outer patterns when the target pattern includes a 1D pattern.

15. The computer-implemented method of claim 10, wherein changing the sizes of the plural outer patterns comprises changing, using a processor, X-direction space sizes or Y-direction space sizes of the plural outer patterns when the target pattern includes a 2D pattern.

16. The computer-implemented method of claim 11, wherein the inner patterns at an inner side of the target outer patterns are formed to have the same size as a cell.

17. The computer-implemented method of claim 10, wherein changing the sizes of the plural outer patterns comprises changing, using a processor, the sizes of the plural outer patterns in a range of approximately 20% to approximately 70% of corresponding simulation contours corresponding to the original layout.

18. A computer-implemented method for controlling pattern uniformity in a semiconductor device in a computer network, the method comprising:
    providing an original layout of a photo-mask with respect to target patterns, wherein the original layout includes at least one outer pattern and inner patterns disposed at an inner side of the at least one outer pattern;
    changing, using a processor, a size of the at least one outer pattern, the size of the at least one outer pattern including one or both of a space size and a pattern width;
    obtaining, using a processor, uniform distribution values with respect to changed sizes of target patterns corresponding to the inner patterns according to the size change of the at least one outer pattern; and
    determining, using a processor, a changed size of the at least one outer pattern corresponding to one of the uniform distribution values as a size of a target outer pattern.

19. The computer-implemented method of claim 18, wherein obtaining the uniform distribution values comprises:
    obtaining, using a processor, simulation contours with respect to the changed sizes of the respective target patterns corresponding to inner patterns positioned at an inner side of the at least one outer pattern according to the size change of the at least one outer pattern; and
    obtaining, using a processor, the uniform distribution values corresponding to the respective simulation contours.

20. The computer-implemented method of claim 18, wherein changing the size of the at least one outer pattern comprises changing, using a processor, one or both of a space size and a line width of the at least one outermost pattern when the target pattern includes a 1D pattern.

* * * * *